United States Patent
Laureano et al.

(10) Patent No.: US 10,983,176 B2
(45) Date of Patent: Apr. 20, 2021

(54) DEVICES, SYSTEMS AND METHODS FOR DETECTING REVERSED POLARITY AND/OR BOOTLEG GROUNDED ELECTRICAL OUTLETS

(71) Applicant: DISH Network L.L.C., Englewood, CO (US)

(72) Inventors: Reynaldo Laureano, Centennial, CO (US); Jackson Louie, Aurora, CO (US)

(73) Assignee: DISH Network L.L.C., Englewood, CO (US)

( * ) Notice: Subject to any disclaimer, the term of this patent is extended or adjusted under 35 U.S.C. 154(b) by 154 days.

(21) Appl. No.: 16/400,215

(22) Filed: May 1, 2019

(65) Prior Publication Data

US 2020/0348351 A1    Nov. 5, 2020

(51) Int. Cl.
*G01R 31/69* (2020.01)
*G01R 31/50* (2020.01)

(52) U.S. Cl.
CPC ............ *G01R 31/69* (2020.01); *G01R 31/50* (2020.01)

(58) Field of Classification Search
CPC ............ G01R 31/50; H02J 9/02; H02J 15/00
See application file for complete search history.

(56) References Cited

U.S. PATENT DOCUMENTS

| 2005/0275409 A1* | 12/2005 | Mason | G01R 31/69 324/508 |
| 2009/0212785 A1* | 8/2009 | Radle | G01R 31/69 324/508 |
| 2016/0327599 A1* | 11/2016 | Wiesemann | G01R 1/04 |

OTHER PUBLICATIONS

Ideal Industries Inc., "Ideal Industries Inc., Technical Manual Model 61-160 Series", "Technical Manual, Model 61-160 Series", Sep. 1, 2009, p. 10, Publisher Ideal Industries Inc.; obtained from Internet via Google Search.

Ideal Industries Inc, "Ideal 61-061 E-Z Check Plus GFCI Tester/Receptacle Tester", Jul. 27, 2006, p. 2, Publisher: Ideal Industries Inc, Published in: obtained from Internet at: https://www.specialized.net/ideal-61-051-e-z-check-plus-gfci-tester-receptacle-tester.html.

Ideal Industries Inc., "Branch Circuits Protected by AFCI Devices and IDEAL SureTest (TM) Circuit Analyzers (version 3)", Aug. 2008, p. 8, Publisher: Ideal Industries.

Ideal Industries Inc., "SureTest (TM) Circuit Analyzer", obtained from Internet on Apr. 17, 2019 at https://idealind.com/shop/61-164.html.

* cited by examiner

*Primary Examiner* — Alvaro E Fortich
(74) *Attorney, Agent, or Firm* — Wash Park IP Ltd.; John T. Kennedy

(57) ABSTRACT

Devices, systems and methods for detecting reversed polarity bootleg ground wiring configurations of an electrical outlet are disclosed. For at least one embodiment, a system in includes a test transmitter and a test receiver. The test receiver being configured to detect a ping generated by the test transmitter and determine whether the ping is received via a proper receptacle of an outlet being tested. The system also includes a test receiver configured to determine is a bootleg ground configuration exists using one of time domain reflectometry and/or a resistance based measurement approach. A method for testing an outlet includes one or both of testing for reversed polarity and bootleg ground configurations.

20 Claims, 6 Drawing Sheets

DEVICES, SYSTEMS AND METHODS FOR DETECTING REVERSED POLARITY AND/OR BOOTLEG GROUNDED ELECTRICAL OUTLETS

TECHNICAL FIELD

The technology described herein generally relates to devices, systems and methods for detecting improperly wired electrical outlets. More specifically, the technology described herein relates to detecting electrical outlets which have been wired in one or more of a bootleg ground and/or a reversed polarity configuration. Even more specifically, the technology described herein relates to detecting electrical outlets which have been wired in both a reversed polarity, bootleg ground (RPBG) configuration.

BACKGROUND

Electrical outlets are commonly used in residential and commercial construction to provide electrical energy to a powered device. Such electrical energy is commonly provided at a given voltage potential, such as 120 Volts Alternating Current ("AC") in the United States, and within a maximum ampere rating for a given electrical circuit to which a given electrical outlet is wired. Electrical circuits, and outlets used therewith, are commonly regulated by one or more electrical codes, such as the National Electrical Code ("NEC") used in many jurisdictions within the United States. Different electrical codes and/or standards may be used in different U.S. and/or non-U.S. jurisdictions, the same being collectively referred to herein as the "electrical code" and/or as the "code."

An electrical code commonly provides that a given electrical outlet, such as one rated in the U.S. for 120 VAC, and the circuit used therewith, is rated at a nominal rated capacity, such as 15 Amperes, and a continuous rated capacity, such as 12 amperes, the latter often being 20% less than the former. Per such electrical codes, single phase electrical circuits today are commonly configured to include a "ground" conductor line, a "neutral" or "return" conductor line (hereinafter, a "neutral" line) and a "hot" conductor line. Further, such circuits are configured to not exceed given ampere ratings by use of circuit breakers, commonly located in a service panel. During normal conditions, the circuit breaker is configured into a "closed circuit" state which allows electrical power to flow from a source, such as a main transmission line, to the one or more outlets on that given electrical circuit. However, when non-normal or faulty conditions arise, an ampere imbalance between the normally conducting neutral and hot lines is desirably detected by the circuit breaker which then enters into a short-circuit state. Such flipping, is commonly referred to as a circuit breaker having "flipped." When in the short-circuit state, electrical power is not provided to the outlet.

During normal conditions, the ground line does not conduct current. During non-normal conditions, however, the ground line provides protections against hazardous voltage conditions. When such hazardous conditions do arise, the ground line conducts electricity away from the device, which results in the detectable imbalance between the current provided via the hot line and the return current provided back to the circuit breaker in the neutral line. In properly wired, electrical code compliant circuits, this imbalance is detected by the circuit breaker, and when it exceeds a fixed value for a fixed time, the circuit breaker enters into the short-circuit state.

Since at least as early as 1962, the U.S. electrical code and other codes have required the use of three conductors, i.e., the ground, neutral and hot leads for all thereafter installed 120 VAC circuits and, since 1999, for all thereafter installed 240 VAC circuits. Further, the 1962 electrical code specified that the outlets and components used therewith must be polarized. That is, the neutral and hot lines are respectively connected to given receptacles in an electrical outlet, with the neutral receptacle of an outlet being longer than the hot receptacle. Electrical devices requiring polarized electrical currents include plugs having prongs configured to fit within such corresponding receptacles. While the ground line is typically connected to the neutral line in the service panel, for purposes of circuit over-voltage and over-current protection, the ground line and the hot line are not considered replaceable or combinable.

Yet, many "legacy circuits" exist in buildings (residential and commercial) that were constructed prior to these dates. In such legacy circuits, a grounding conductor line was not used. Instead, only two conductors (for single-phase circuits) or three conductor (for dual phase circuits) were used. However, today, non-low voltage electrical devices commonly include three prong electrical plugs (for 120 VAC circuits) or four prong electrical plugs (for 240 VAC circuits). Electrical outlets also commonly include three or four receptacles (for respective 120 VAC and 240 VAC circuits).

As shown in FIG. 1A, a code compliant, first circuit configuration 100-A for a grounded and polarized, 120 VAC outlet properly wired according to the post-1962 electrical code commonly includes a first/tested outlet 104 having neutral, ground and hot receptacles respectively wired to a first circuit breaker 102 by a first ground line 106, a first neutral line 108 and a first hot line 110. The first circuit breaker 102 may be located in a service panel in a building, dwelling or other structure (collectively herein, a "building").

As shown in FIG. 1B, a non-code compliant second circuit configuration 100-B may include a bootleg ground configuration wherein a three or four prong outlet is wired to a legacy circuit line having less than three conducting lines. Such a configuration is often used to avoid the time, cost and expense that may be needed to run a ground conductin. Instead, a ground jumper 112 is used to connect the ground receptacle of the first/tested outlet 104 with the first neutral line 108. As shown, 1st neutral line 108 and the first hot line 110 are electrically connected to the first circuit breaker 102.

As shown in FIG. 1C, a non-code compliant third circuit configuration 100-C may include a configuration wherein a person has inversely connected the neutral and hot lines such that a reversed polarity configuration exists. That is, the first neutral line 108 is connected the hot receptacle of the first/tested outlet 104 and the first hot line 110 is connected to the neutral receptacle of the first/tested outlet 104. The first ground line 106 is connected to the ground receptacle of the first/tested outlet 104. The first ground line 106, first neutral line 108, and first hot line 110 are electrically connected to the first circuit breaker 102.

As shown in FIG. 1D, another non-code compliant fourth circuit configuration 100-D may include a configuration wherein both a bootleg ground configuration and a reversed polarity configuration occur. That is, the ground jumper 112 may be connected with the first hot line 110 which is improperly connected to the neutral receptacle of the first/tested outlet 104, and the first neutral line 108 is improperly connected to the hot receptacle of the first/tested outlet 104.

The first neutral line 108 and the first hot line 110 are electrically connected to the first circuit breaker 102.

In improperly wired, non-code compliant circuits such as those shown in FIGS. 1B and 1D, the electricity will follow the path of least resistance, which when a ground conductor line back to a circuit breaker in a service panel is not present, may include a user, the electrical device itself, or otherwise. Such conditions may result in electrical fires, electrical shocks, and/or other damage to persons and/or property. Further, when an outlet is both reversed polarized and bootleg grounded, the ground receptacle will actually be "hot" which present non-safe and hazardous conditions.

Likewise, when one of circuits of FIGS. 1B and 1D are used with an electrical device (such as a satellite receiver) that is electrically connected by a second circuit to a properly grounded device (such as a satellite antenna), the second circuit may, effectively, acts as the ground circuit. Such second circuit may not be capable of handling the electrical power provided by a non-code compliant outlet. An example of such a situation may arise when a device, such as a television set-top box, a computer or otherwise connected to a non-code compliant outlet is also connected by an Ethernet cable to a router that is connected to a code compliant outlet. Accordingly, a grounded pathway will typically arise from the Ethernet cable, which under a fault condition, could quickly overheat and cause an electrical fire, electrical shocks or other dangerous conditions to occur.

As is well known, various devices exist today for detecting bootleg ground configurations and reversed polarized configurations. Specifically, three prong testing devices commonly available can identify the following conditions: (1) open ground; (2) open neutral; (3) open hot; (4) hot and ground reversed; (5) hot and neutral reversed—as per FIG. 1C; and (6) the correct configuration—as per FIG. 1A. However, such testing devices do not detect the bootleg ground configuration, as shown above in FIG. 1B, or the reversed polarity bootleg ground configuration, as shown above in FIG. 1D.

Accordingly, a needs exists for devices, systems and methods for detecting improperly wired electrical outlets, such as outlets configured according to the second or fourth circuit configurations. Desirably, such devices, systems and methods do not require a physical inspection of an outlet to detect such second and fourth circuit configurations.

SUMMARY

The various embodiments of the present disclosure relate in general to devices, systems and methods for detecting improperly configured electrical outlets. In accordance with at least one embodiment of the present disclosure, devices, systems and methods for detecting reversed polarity and/or bootleg grounded electrical outlets are described.

For at least one embodiment of the present disclosure, a system for testing an electrical outlet includes a test receiver and a test transmitter. The test receiver may include a hot receive prong configured for electrical coupling the test receiver with a first hot line of an electrical circuit. The test receiver may also include a signal receiver, coupled to the hot receive prong, configured to detect when a ping signal is present on the first hot line. A test transmitter may include a hot test prong configured for electrical coupling the test transmitter with a second hot line of the electrical circuit. The test transmitter may also include a signal generator, coupled to the hot test prong, configured to generate the ping signal on the second hot line. For at least one embodiment, the first hot line and the second hot line may be electrically coupled via the electrical circuit.

For at least one embodiment, a system may be configured for use where the first hot line is electrically coupled to a first hot receptacle of a first electrical outlet and wherein the hot receive prong is configured for mating with the first hot receptacle. Further, for at least one embodiment, when mated, the test receiver may be electrically coupled to the first hot line via the hot receive prong and the first hot receptacle.

For at least one embodiment, the system may be configured for use wherein the second hot line is electrically coupled to a second hot receptacle of a second electrical outlet and wherein the hot test prong is electrically coupled with the second hot line via the second hot receptacle.

For at least one embodiment, the system may be configured for use wherein the electrical circuit includes at least one circuit breaker coupled to the first hot line and the second hot line. For at least one embodiment, the electrical circuit may include a main circuit breaker coupling the at least one circuit breaker to an external power line via a main hot line. For at least one embodiment, the main circuit breaker, when configured in an open-circuit configuration, electrically isolates the main hot line from the external power line. For at least one embodiment, the hot test prong is electrically coupled to the main hot line.

For at least one embodiment, the system may be configured for use with a test receiver that includes a neutral receive prong. The neutral receive prong may be configured for electrical coupling with a first neutral line of the electrical circuit. For at least one embodiment, the signal receiver may be coupled to the neutral receive prong and configured to: detect when a ping signal is present at the neutral receive prong; and when the ping signal is detected at the neutral receive prong generate a first fault condition signal.

For at least one embodiment, the system may be configured for use when the first neutral line is electrically coupled to a first neutral receptacle of the first electrical outlet. For at least one embodiment, the neutral receive prong may be electrically coupled with the first neutral line via the first neutral receptacle. For at least one embodiment, a first fault condition signal indicates a reversed polarity wiring configuration exists for the first electrical outlet.

For at least one embodiment, the system may be configured for use wherein the test receiver includes a ground receive prong. The test receiver may also include a bootleg ground tester, coupled to the ground receive prong, configured to detect a bootleg ground wiring configuration of a first ground line with one of the first hot line and the first neutral line. The bootleg ground test may also be configured to, when a bootleg ground wiring configuration is detected, generate a second fault condition signal.

For at least one embodiment, the system may be configured for use with a bootleg ground tester that utilizes time domain reflectometry.

For at least one embodiment, the system may be configured for use when the first ground line is electrically coupled to a first ground receptacle of the first electrical outlet, the ground receive prong is electrically coupled with the first ground line via the first ground receptacle, and the second fault condition signal indicates a bootleg ground wiring configuration exists for the first electrical outlet.

For at least one embodiment, the system may be configured for use when, upon generation of each of the first fault condition signal and the second fault condition signal, the test receiver is further configured to generate a third fault signal indicating existence of a reversed polarity bootleg ground wiring configuration for the second electrical outlet.

For at least one embodiment, the system may be configured for use with a test receiver that includes an output module configured to provide a humanly perceptible output indicative of, when present, the first fault signal, the second fault signal and the third fault signal.

For at least one embodiment, the system may be configured for use when a test receiver includes a wireless communications interface module configured to communicate, when present, the first fault signal, the second fault signal and the third fault signal to a mobile device.

For at least one embodiment, the system may be configured for use when the test receiver includes a wireline communications interface module configured to communicate, when present, the first fault signal, the second fault signal and the third fault signal to the test transmitter.

For at least one embodiment of the present disclosure, a receiver configured for use in testing compliance of an electrical circuit with an electrical code may include a hot receive prong configured for electrical coupling a test receiver with a first hot line of an electrical circuit. The receiver may also include a neutral receive prong configured for electrical coupling the test receiver with a first neutral line of the electrical circuit. The receiver may also include a signal receiver, coupled to each of the hot receive prong and the neutral receive prong, configured to detect when a ping signal is present at either of the hot receive prong or the neutral receive prong, and when the ping signal is detected at the neutral receive prong, generate a first fault condition signal.

For at least one embodiment of the present disclosure, a receiver configured for use in testing compliance of an electrical circuit with an electrical code may be configured for use when a ping is received that originates from a test transmitter electrically coupled to a second hot line of the electrical circuit. For at least one embodiment, the first hot line and the second hot line may be commonly electrically coupled to a first circuit breaker.

For at least one embodiment of the present disclosure, a receiver configured for use in testing compliance of an electrical circuit with an electrical code may be include a ground receive prong configured for electrical coupling the test receiver with a first ground line of the electrical circuit. The receiver may also include a bootleg ground tester, coupled to the ground receive prong, configured to: detect a bootleg ground wiring configuration of the first ground line with one of the first hot line and the first neutral line; and when the bootleg ground wiring configuration is detected, generate a second fault condition signal.

For at least one embodiment of the present disclosure, a receiver configured for use in testing compliance of an electrical circuit with an electrical code may include an output module, coupled to the signal receiver and the bootleg ground tester, configured to generate a test result based upon at least a presence or absence of the first fault condition signal and the second fault condition signal. The receiver may be configured for use with an electrical outlet having a neutral receptacle, a ground receptacle and a hot receptacle. The receiver being configured for electrical connection with each of a first neutral line, a first hot line and a first ground line. For at least one embodiment, during testing, the hot receive prong is electrically coupled to the hot receptacle, the neutral receive prong is electrically coupled to the neutral receptacle, and the ground receive prong is electrically coupled to the ground receptacle. For at least one embodiment a first fault signal, when generated, is indicative of a reversed polarity configuration for the electrical outlet. For at least one embodiment, a second fault signal, when generated, is indicative of a bootleg ground configuration for the electrical outlet.

For at least one embodiment of the present disclosure, a receiver configured for use in testing compliance of an electrical circuit with an electrical code may be configured to generate a test result that is one of the test results of Table 1 below.

For at least one embodiment of the present disclosure, a method, for testing an electrical outlet for compliance with an electrical code, may include monitoring a hot receptacle of an electrical outlet for a presence of a ping; monitoring a neutral receptacle of an electrical outlet for a presence of the ping; and generating a first fault signal when the ping is detected at the neutral receptacle. For at least one embodiment, a first fault signal indicates an electrical circuit coupling the electrical outlet to a circuit breaker is configured into a reversed polarity wiring configuration for the electrical outlet For at least one embodiment of the present disclosure, a method, for testing an electrical outlet for compliance with an electrical code, may include performing a bootleg ground test for the electrical outlet, the electrical outlet including a ground receptacle. For at least one embodiment, the method may include generating a second fault signal when the bootleg ground test indicates a ground jumper connects the ground receptacle with the neutral receptacle. For at least one embodiment, the method may include generating a third fault signal when the bootleg ground test indicates the ground jumper connects the ground receptacle with the hot receptacle. For at least one embodiment, one or more and/or each of the second fault signal and the third fault signal indicate a bootleg ground wiring configuration for the electrical outlet. For at least one embodiment, generation of the first fault signal with either of the second fault signal and the third fault signal indicates a reversed polarity bootleg ground wiring configuration for the electrical outlet.

BRIEF DESCRIPTION OF THE DRAWINGS

The features, aspects, advantages, functions, modules, and components of the devices, systems and processes provided by the various embodiments of the present disclosure are further disclosed herein regarding at least one of the following descriptions and accompanying drawing figures. In the appended figures, similar components or elements of the same type may have the same reference number and may include an additional alphabetic designator, such as 108a-108n, and the like, wherein the alphabetic designator indicates that the components bearing the same reference number, e.g., 108, share common properties and/or characteristics. Further, various views of a component may be distinguished by a first reference label followed by a dash and a second reference label, wherein the second reference label is used for purposes of this description to designate a view of the component. When only the first reference label is used in the specification, the description is applicable to any of the similar components and/or views having the same first reference number irrespective of any additional alphabetic designators or second reference labels, if any.

DETAILED DESCRIPTION

Figure 1A:
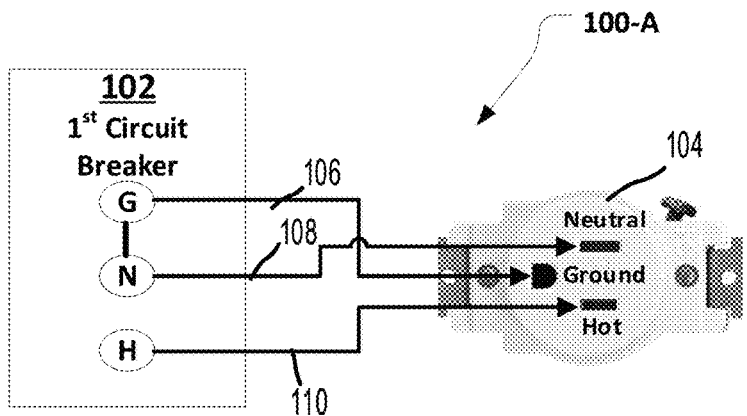
FIG. 1A is a schematic diagram of a first circuit configuration having a Code compliant configuration.
Figure 1B:
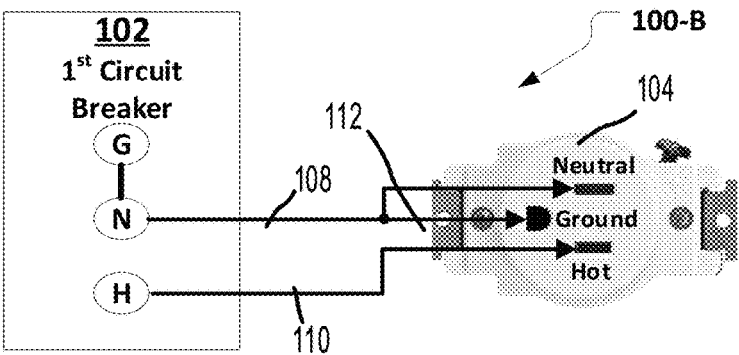
FIG. 1B is a schematic diagram of a second circuit configuration having a non-code compliant bootleg ground configuration.
Figure 1C:
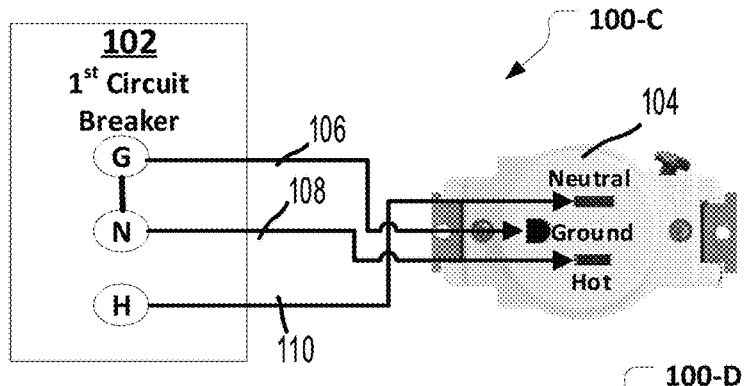
FIG. 1C is a schematic diagram of a third circuit configuration having a non-code compliant reverse polarity configuration.
Figure 1D:
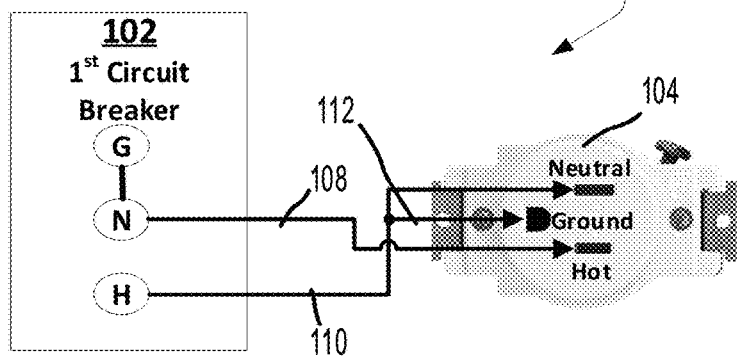
FIG. 1D is a schematic diagram of a fourth circuit configuration having a non-code compliant reverse polarity bootleg ground ("RPBG") configuration.

The various embodiments described herein are directed to devices, systems and methods for detecting non-Code compliant bootleg ground and/or reverse polarized configurations. For at least one embodiment, such devices, systems and methods facilitate the testing of an electrical outlet without requiring the removal of electrical outlet cover plates and/or removal of an electrical outlet from a wall enclosure or otherwise.

As shown in FIGS. 2 to 5, and in accordance with at least one embodiment of the present disclosure, a system for testing an electrical outlet includes a test transmitter 220 and a test receiver 230. The test transmitter 220 may include a transmit power source 222, such as a battery, a signal generator 224, a ground test prong TG, a hot test prong TH, and a neutral test prong TN. The test prongs TG, TH and TN are configured for insertion into a second/transmit outlet 200, with at least the hot test prong TH being configured from an electrically conductive material. The hot test prong TH is electrically coupled to a signal generator 224.

For at least one embodiment, one or more of the ground test prong TG and the neutral test prong TN may be configured from non-electrically conductive, insulating materials and may be provided to ensure a firm and proper physical connection of the test transmitter 220 with the second/test outlet 200. The signal generator 224 is configured to generate and output to the second/transmit outlet 200, via the hot test prong TH, an electrical "ping" signal. The ping signal may be a steady tone, a wavering or varying tone, a repeating pattern, or otherwise. In at least one embodiment, the signal generator 224 is configured for use with known Powerline Communications (PLC) technologies. For at least one embodiment, the signal generator 224 may be configured to generate a unique electrical signal having a repeating pattern operating in a frequency range of 30 to 50 MHz. It is to be appreciated, that other frequency ranges may be used, but, frequencies less than 100 MHz may be more subject to interference from noise on powered circuit lines. The electrical signal generated by the signal generator 224, for at least one embodiment, may be a low voltage signal which is defined herein as a signal having a voltage of 12 volts direct current (DC) or less. However, other voltages, in either DC or AC format, may be used in other embodiments of the present disclosure.

For at least one embodiment, the second/transmit outlet 200 is electrically connected to a second circuit breaker 202. The first circuit breaker 102 and the second circuit breaker 202 are electrically connected within a building via one or more service panels. The second/transmit outlet 200 is considered a "known" outlet that is known to be code compliant. Verifying the second/transmit outlet 200 is code compliant can be accomplished by inspection, a process of testing and elimination of circuits within a building, or otherwise.

As further shown in FIGS. 2 to 5, and in accordance with at least one embodiment of the present disclosure, the system for testing an electrical outlet includes a test receiver 230 having a receive power source 232, such as a battery, a signal receiver 234 a bootleg ground tester 236, and input module 238, and outlet module 240, a ground receive prong RG, a hot receive prong RH, and a neutral receive prong RN. The receive prongs RG, RH, and RN are configured for insertion into the first/tested outlet 104. For at least one embodiment, each of the receive prongs RG, RH and RN are configured from electrically conductive materials. The input module 238 may be configured to permit selection of one or more test conditions, such as testing for a bootleg ground configuration, a reversed polarity configuration and/or a reversed polarity bootleg ground configuration. Other test conditions may also be specified for other embodiments.

For at least one embodiment, the test receiver 230 is configured to detect the ping generated by the test transmitter 220. As discussed above, the test transmitter 220 generates and outputs the ping onto the $2^{nd}$ hot line 220. Such ping desirably propagates through the electrical circuits commonly electrically coupled to each other via the one or more service panels within a building. The test receiver 230, via the signal receiver 234, may check one of more of the receptacles in the first/tested outlet 104 for the presence of the ping. That is, the first hot line 110, via the hot receptacle of the first/tested outlet 104, and the hot receiver prong RH may be checked for the presence of the ping. Further, the first neutral line 108, via the neutral receptacle of the first/tested outlet 104, and the neutral receiver prong RN may be checked for the presence of the ping. Last, the first ground line 106, via the ground receptacle of the first/tested outlet 104, and the ground receiver prong RG may be checked for the presence of the ping. Depending on which of these tests returns a positive detection of the ping, the compliance and wiring configuration of the first/tested outlet 104 can be determined. The test receiver 230 may be configured to indicate such testing condition using the output module 240. The output module 240 may be configured to convey such test results using any humanly perceptible signaling mechanism, such as one or more light-emitting diodes, a display screen, audibly, or otherwise. As shown in FIGS. 2 to 5 and depending on the wiring configuration of the first/tested outlet 104, one or more reversed polarity and/or bootleg ground and other tests may be accomplished.

Figure 2:
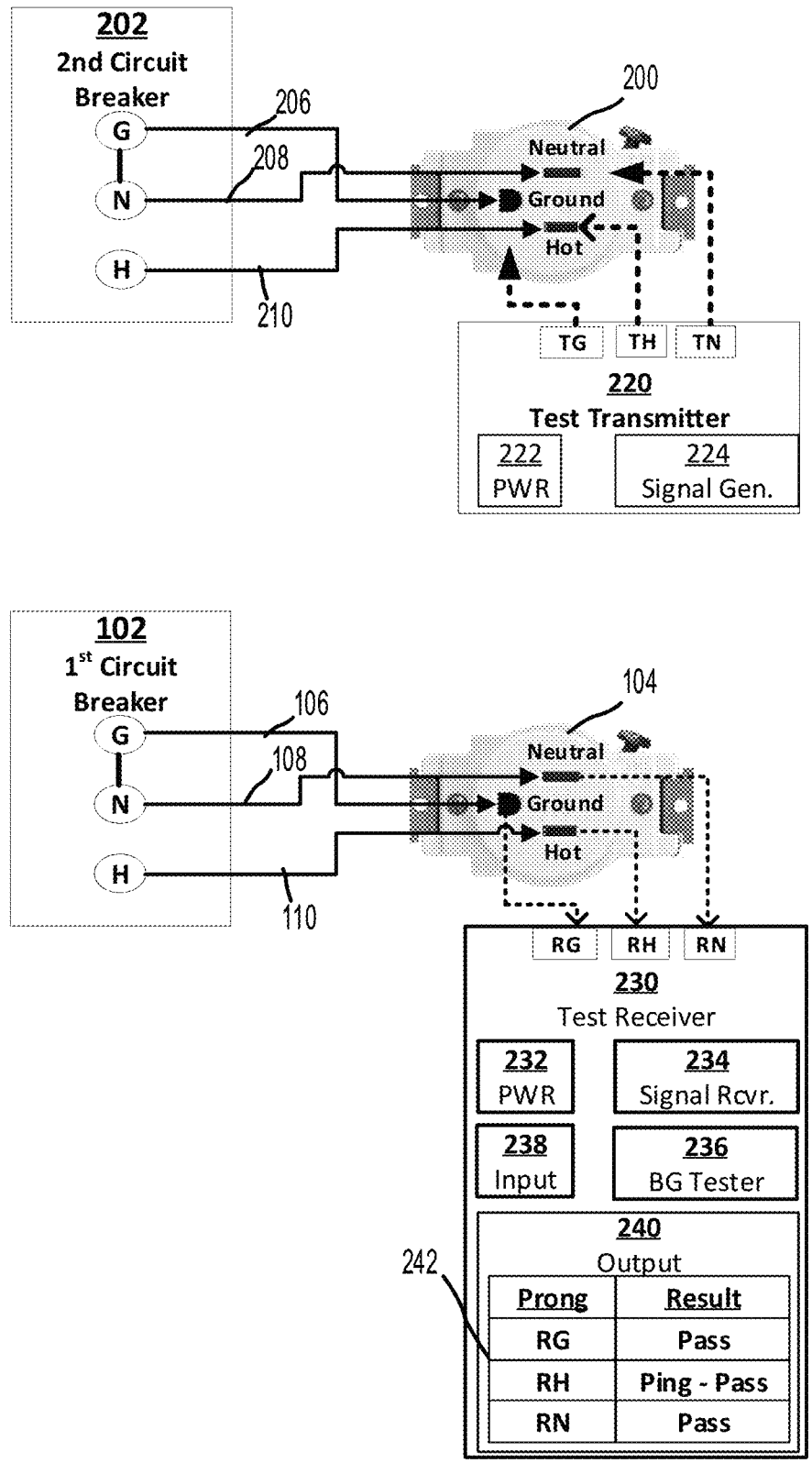
FIG. 2 is a schematic diagram of a first testing scenario and results arising from testing a Code compliant/first configuration, in accordance with at least one embodiment of the present disclosure.
Figure 4:
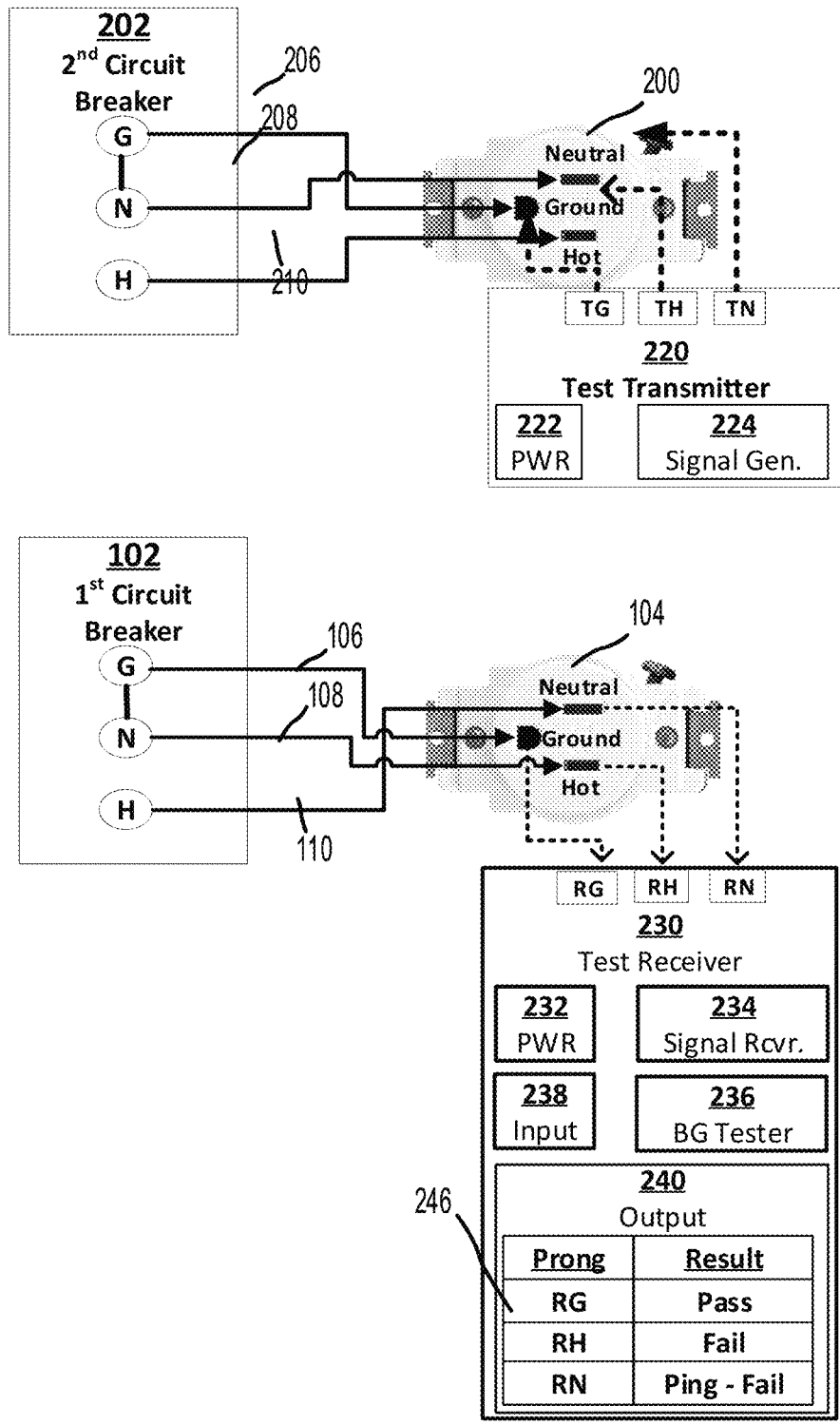
FIG. 4 is a schematic diagram of a first testing scenario and results arising from testing a non-Code compliant outlet reverse polarized/3rd configuration, in accordance with at least one embodiment of the present disclosure.
Figure 5:
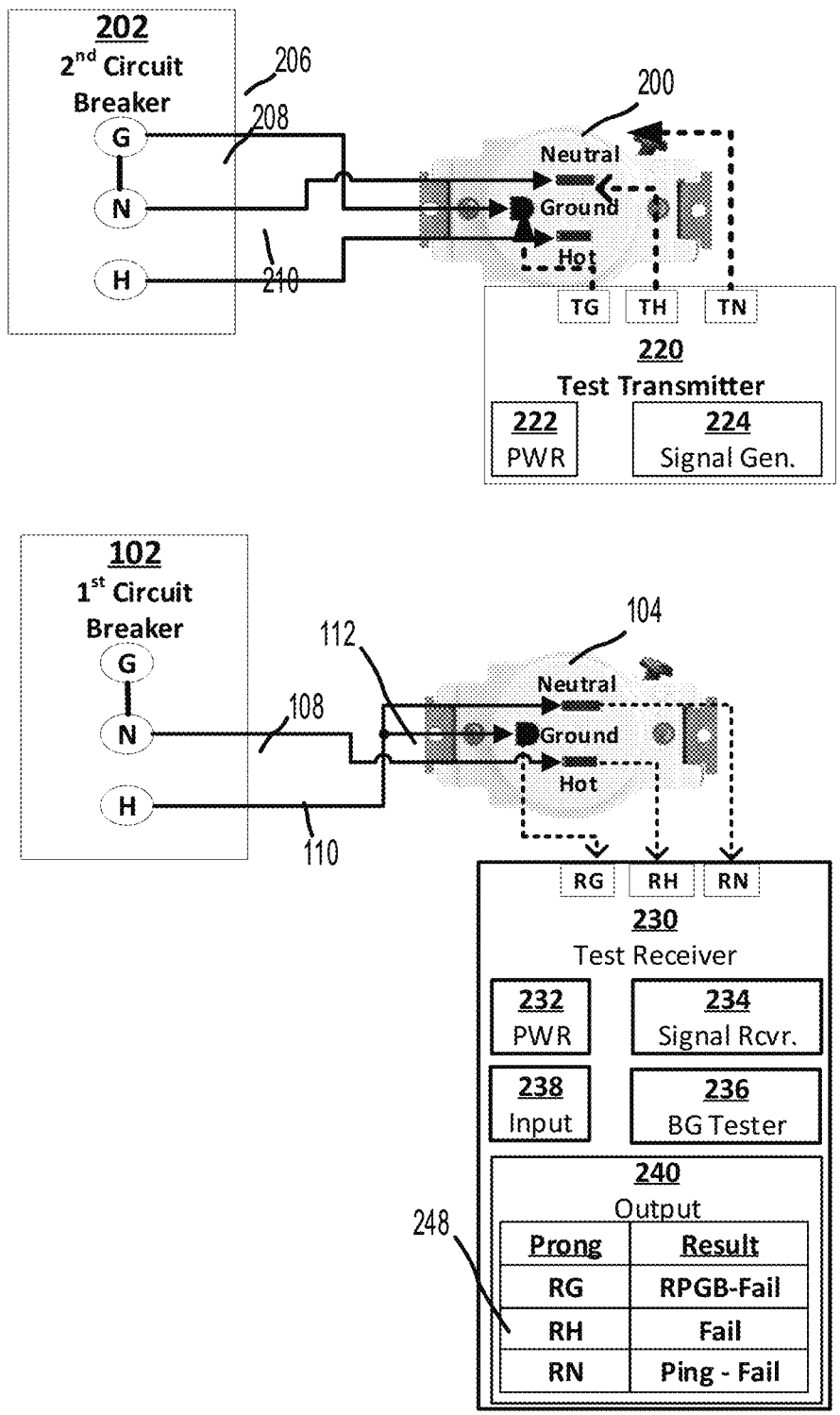
FIG. 5 is a schematic diagram of a first testing scenario and results arising from testing a non-Code compliant outlet reverse polarized, bootleg ground (RPBG)/$4^{th}$ configuration, in accordance with at least one embodiment of the present disclosure.

For example, as shown in FIG. 2, when the first/tested outlet is electrically connected to the first circuit 102 in a proper polarity configuration, the signal receiver 234 will detect the ping only at the hot receive prong RH and via a circuit formed, at least in part, by the first/hot line 110. This result may be presented in a first test results 242, as shown in FIG. 2, where the RH prong is indicated as having a ping present. Similarly, in FIG. 3, where the first neutral line 108 and the first hot line 110 are also properly polarized, as connected to the first/tested circuit 102, a second test results 244 may indicate the RH prong as having a ping present. Contrarily, and as shown in FIGS. 4 and 5, wherein for the third and fourth configurations, the polarity of the hot and neutral lines are reversed, a respective third test result 246 and a fourth test result 248, may indicate the absence of the ping at the RH prong and the presence of the ping at the RN prong. Thus, it is to be appreciated that by use of a test transmitter 220 configured to output a ping on the second hot line 210 and use of a test receiver 230 configured to detect the presence of the ping on one or more of the first neutral line 106 and/or the first ground line 108, a reversed polarity configuration can be detected.

As discussed above, the test receiver 230 may also be configured to detect bootleg ground configurations. Such configurations may arise with or without a reversed polarity configuration and may be detected solely by use of the test receiver 230. For at least one embodiment, such testing may be conducted using a bootleg ground tester 236 suitably configured for detecting bootleg ground conditions.

More specifically, for at least one embodiment, the bootleg ground tester 236 may be configured to detect bootleg ground configurations by use of time domain reflectometery (TDR). As is well known, TDR can be used to determine a distance of a discontinuity in an electrical conductor based upon an amount of time needed for an electrical signal to be reflected back, by the discontinuity in such conductor, to a transmitting source. Accordingly, the bootleg ground tester 236 is suitably connected to the ground receive prong RG of the test receiver 230 and a discontinuity in the ground line quickly arises at the junction of a ground jumper 112 with the first neutral line 108 or with the first hot line 110. It is to be appreciated that for a bootleg ground configuration, reflection of the test signal occurs substantially immediately. In comparison, for a non-bootleg/code-compliant grounded circuit configuration, reflection of the test signal takes a substantially longer period of time. It is to be appreciated, however, that precise time measurements are not typically not required and any reflectance of a signal emitted by the bootleg ground tester 236 within less than a nanosecond and for at least one embodiment less than 0.000001 milliseconds will typically be representative of a bootleg grounded configuration for a given electrical outlet.

For at least another embodiment, the bootleg ground tester 236 may be configured to detect bootleg ground configurations by use of resistance based technologies. For example, using each of the ground receive prong RG, the hot receive prong RH, and the neutral receiver prong RN, the resistance of each conducting line for given circuit can be measured. Ideally, each of the conducting lines (ground, neutral and hot) have the same length and are of the same gauge of wire and each such line should have substantially the same resistance. In the case of a bootleg ground configuration, one or more of such conducting lines will have less length and thus less resistance than the others. Such resistance differences being detectable by the bootleg ground tester 236. When the resistance of any two of ground line and the neutral line as compared to the hotline, or the ground line and the hot line as compared to the neutral line are not substantially the same, a bootleg ground configuration (or other fault condition) likely exists.

As shown in FIG. 2 where in a first configuration 100-A, code compliant circuit configuration is shown, the first test results 242 may indicate a "pass" condition for each of the RG, RH and RN prongs. Such "pass" condition may be indicated in any desired manner, such as by the activation or non-activation of one or more light emitting diodes.

Figure 3:
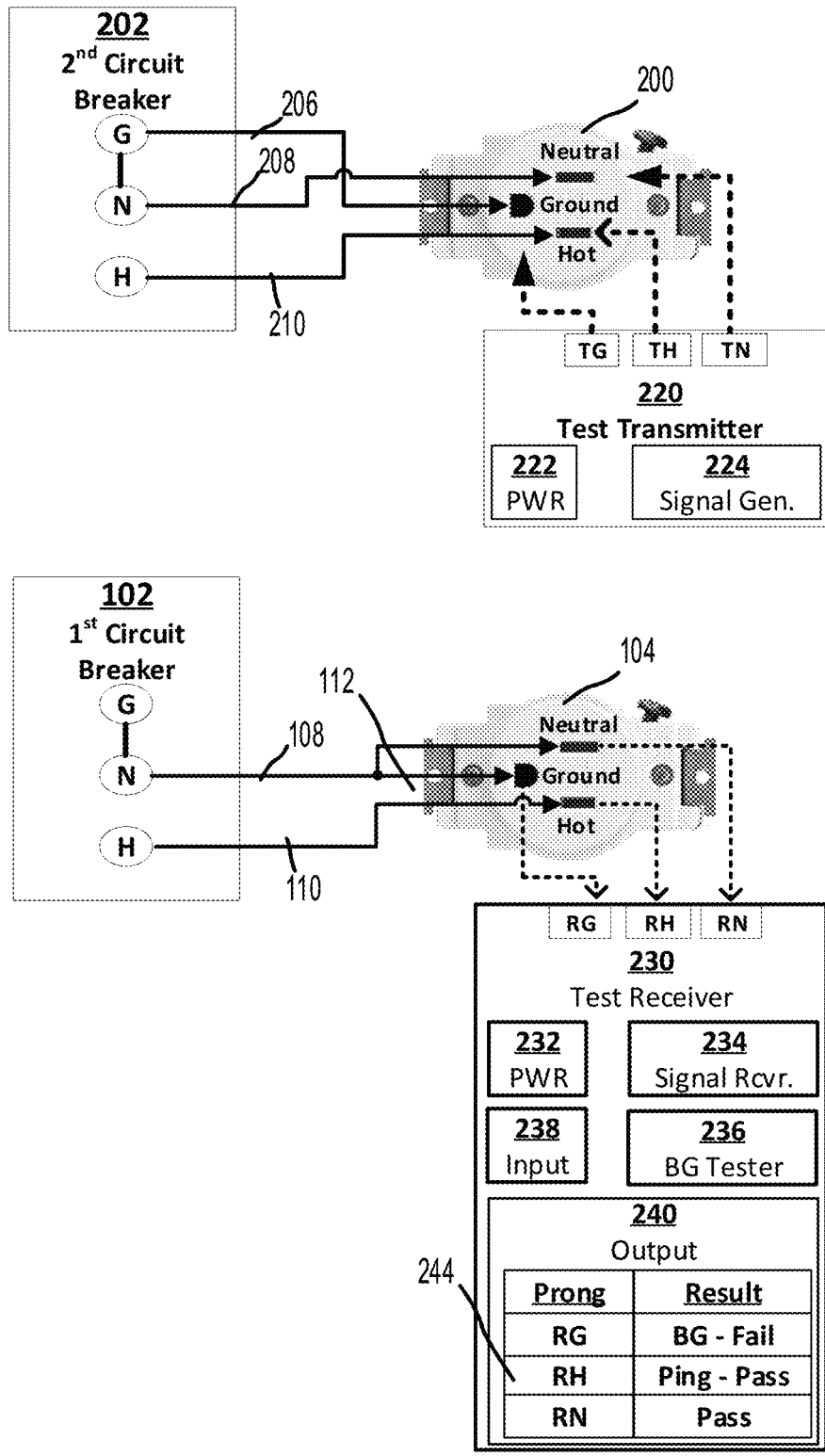
FIG. 3 is a schematic diagram of a first testing scenario and results arising from testing a non-Code compliant outlet bootleg ground/2nd configuration, in accordance with at least one embodiment of the present disclosure.

As shown in FIG. 3, wherein a second circuit configuration 100-B, bootleg ground properly polarized configuration is shown, the second test results 244 may indicate a "fail" condition for the bootleg ground testing (indicating use thereof) and pass for the reverse polarity testing.

As shown in FIG. 4, wherein a third circuit configuration 100-C, reserve polarity proper ground circuit configuration is shown, the third test results 246 may indicate a "fail" condition for the reversed polarity testing and a pass for the bootleg ground testing.

As shown in FIG. 5, wherein a fourth circuit configuration 100-D, reversed polarity bootleg ground circuit configuration is shown, the fourth test results 248 indicate a "fail" for condition for each of the prongs (RG, RN and RH) indicating failure of both the reversed polarity testing and the bootleg ground testing.

As further shown in FIGS. 2 to 5, the results of the bootleg ground tester 236 may be conveyed to a user using an output module 240. Further, the test receiver 230 may be configured to perform one or more prior art circuit configuration tests. Accordingly, the output module 240 may be configured to show known, prior-art testing results and/or the new testing results obtainable using an embodiment of the present disclosure. For at least one embodiment, such testing results may be visually represented using light emitting diodes, as show in Table 1, where current testing results detectable using known three-prong testers are indicated by the label "(Prior Art)" and where the second and fourth circuit configurations, now testable using an embodiment of the present disclosure, are identified by the "(New)" label. Other embodiments may present the testing results using other audible, visual or other output technologies.

TABLE 1

| Result | RG | RN | RH |
|---|---|---|---|
| Open Ground (Prior art) | ○ | ● | ○ |
| Open Neutral (Prior art) | ○ | ○ | ● |
| Open Hot (Prior art) | ○ | ○ | ○ |
| Hot/Ground Reversed (Prior art) | ◙ | ○ | ● |
| Hot/Neutral Reversed ($3^{rd}$ Circuit Configuration) (Prior art) | ◙ | ● | ○ |
| Correct ($1^{st}$ Circuit Configuration) (Prior art) | ○ | ● | ● |
| Bootleg Ground Proper Polarity ($2^{nd}$ Circuit Configuration) (New) | ◙ | ○ | ○ |
| Reverse Polarity Bootleg Ground ($4^{th}$ Circuit Configuration) (New) | ◙ | ● | ● |

As shown in Table 1, indicators for the RG, RN and RH lines may use LEDs. For at least one embodiment, different illumination sequences may be used. For an embodiment, different color LEDs may be illuminated to indicate different test results, such as the RG line being illuminated in a "red" color when extremely hazardous conditions arise such as those provided by reversed polarity, bootleg ground and/or reversed polarity bootleg ground configurations. It is further to be appreciated that reversal of the hot and ground conducting lines, though rare, can also occur and is readily detectable using one or more embodiments of the present disclosure.

Further, it is to be appreciated that the system may be used without any main line power being applied to the outlets at the time of testing, with the transmit power source 222 and receive power source 232 providing any power needed to test a given first/tested electrical outlet 104. Accordingly, it is to be appreciated that testing of electrical outlets using an embodiment of the devices, systems and methods of the present disclosure may occur pre or post inspection of an electrical system by a building inspector or otherwise.

For at least one additional embodiment when an electrical system is unpowered, for example, by a main breaker being open-circuited, the test transmitter 220 may be connected, for example, via alligator clips or otherwise, to a main hot line connecting the main breaker to one or more circuit breakers in a service panel. Likewise, multiple test receivers 230 may be connected to each of the outlets on a given circuit to detect which, if any, are improperly wired. Such a configuration may facilitate more efficient testing of multiple electrical outlets in a building, with each of two or more outlets being tested in parallel and results being provided wirelessly to a tester's mobile device. Further, it is to be appreciated that the providing of the ground prong, hot prong and neutral prongs may include any form or shape. For example, a test receiver may be configured with one or more prongs adapted for testing various wiring configurations, such as those for recessed lighting fixtures, switches, security systems, and otherwise.

For at least one embodiment, a test transmitter 220 may also be configured to include an output module (not shown). Such outlet module may be configured to convey, via the test transmitter itself, test results received from one or more test receivers 230. Such test results may be communicated wirelessly to the test transmitter or via the wiring circuits under test. For at least one embodiment, the non-reception of a test result, by a test transmitter and from a given test receiver 230, may be indicative in and of itself of a wiring issue arising with regards to the outlet to which that given test receiver is then connected. Further, to provide test results using the one or more wiring circuits under test, the test receiver may be configured to transmit data across the wiring circuit using PLC or other data transmission technologies. The test transmitter may be configured to receive such communications.

Accordingly, a network of test receivers and a test transmitter maybe configured which facilitates testing of multiple outlets from a central node, and across a plurality of electrical outlet and/or fixture locations. Such network may be used to identify additional faults arising in a given building's electrical system, such as a ground fault arising across multiple outlets when a nail pierces a wiring cable feeding multiple outlets. Such piercing creates a discontinuity that is detectable across the multiple outlets using TDR or other technologies. Using an embodiment of the present disclosure, such measurements may be used to more precisely locate, within a buildings physical structure, the location of such errant nail.

Figure 6:
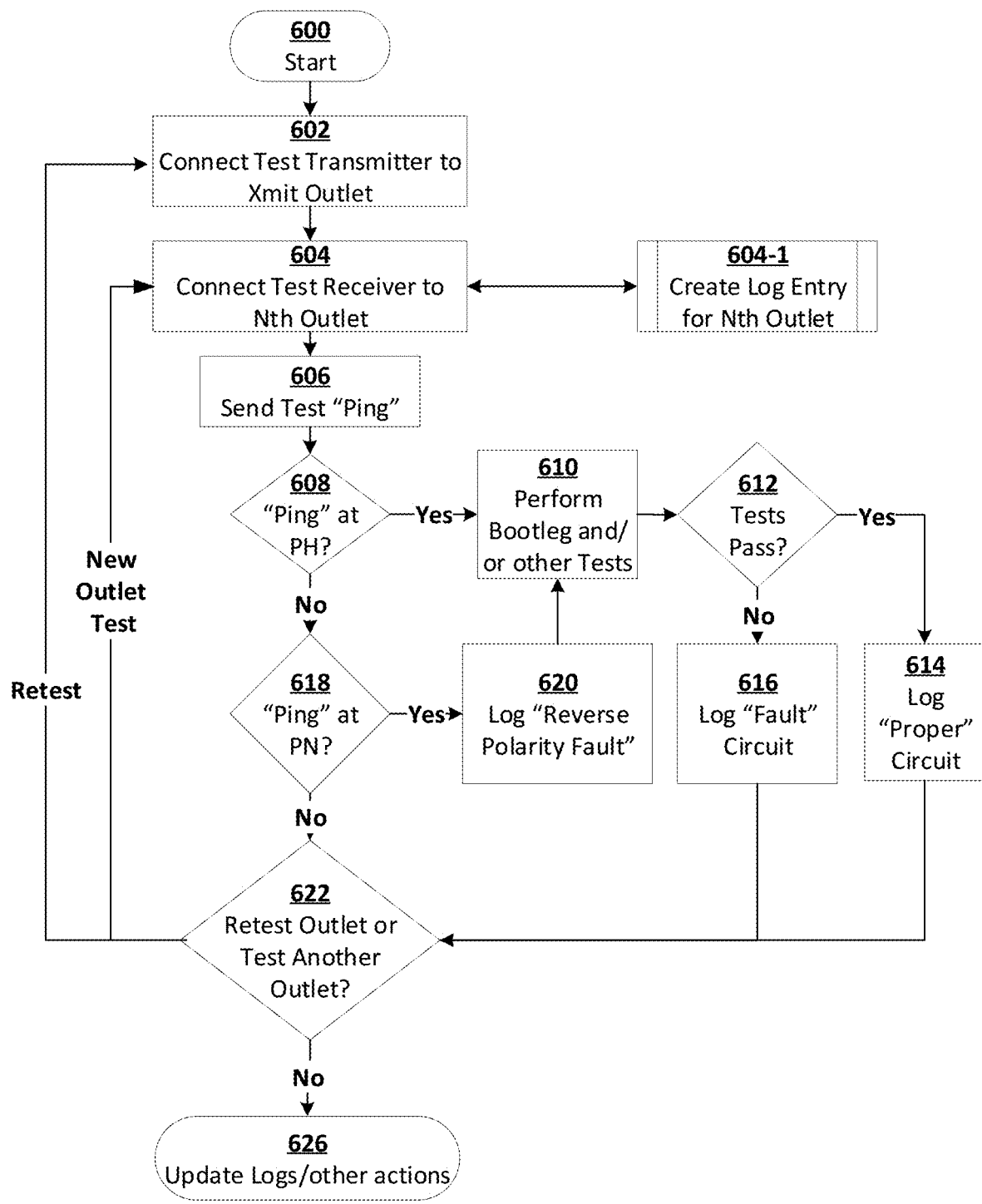
FIG. 6 is a flow chart illustrating a process for testing an electrical outlet for bootleg ground and/or reverse polarized configurations, in accordance with at least one embodiment of the present disclosure.

In FIG. 6, one embodiment of a method for detecting one or more of a bootleg ground and/or a reversed polarity configuration of an electrical outlet is shown. The method starts (as per Operation 600) with identification of a known outlet, such as a second/transmit outlet 200, and identification of an outlet to be tested, such as first/tested outlet 104. Ideally, the second/transmit outlet 200 and the first/tested outlet 104 are electrically coupled via a main or sub-main circuit breaker in a main or sub-main service panel, as the case may be.

As shown in Operation 602, the method includes connecting a test transmitter 220 to the transmit outlet 200. As discussed above, the test transmitter 220 should be connected to the transmit outlet 200 in a proper polarity configuration. Accordingly, the test transmitter 220 may include ground prongs and neutral prongs to ensure such proper alignment.

As shown in Operation 604, the method includes connecting of a test receiver 230 to a first of the first/tested outlet 104. It is to be appreciated that the outlet testing of the present disclosure may involve testing of one or more outlets in a building. Accordingly, FIG. 6, such outlets are identified as the "Nth" outlet. However, the method may be used with the testing of only a single outlet, as may occur when an installer seeks to install a single piece of equipment in a building. That is, testing of an entire building may occur but is not required to occur, in accordance with one or more embodiments of the present disclosure. Also, it is to be appreciated that connection of the test receiver 230 may occur after, before, or otherwise the connection of the test transmitter 220.

As shown in Operation 604-1, the method may include creating a log entry of the Nth outlet to be tested. Such log entry may be entered in one or more of any form, such as paper, electronic, audibly (as in a recorder), visually (such as in a camera) or otherwise. For at least embodiment, logs may be created on an installer's mobile device or other device. Such mobile device may be wirelessly coupled to the test receiver, such as via BLUETOOTH technology or otherwise. Such log entry may be stored in a suitable database for later reference. The log entry may identify date and time of testing, the tester, the particular Nth outlet tested, outlet location in a building, outlet ampere ratings, condition of the outlet, condition of the building, or otherwise. Parameters tested, test results and/or other information may be associated with the log entry.

As shown in Operation 606, the method includes configuring the test transmitter 220 to send a "ping." For at least one embodiment, Operation 606 may occur automatically and upon connecting of the test transmitter 220 to the second/test outlet. For at least one embodiment, Operation 606 may occur upon powering on, selecting of, and/or other configuring of the test transmitter 220 to send the ping. Such configuring may occur automatically, manually, or otherwise. For example, a test transmitter 220 may be wirelessly connected to a test receiver 230 and instructed by the test receiver 220 to send different types of pings. Such different types of pings may be needed when electrical circuits in a building have other signals, including noise, propagating on them. Such different types of pings may be used to uniquely, as desired, identify the ping transmitted by the test transmitter 220 from other signals and/or noise on the electrical system of a building.

As shown in Operation 608, the method includes determining whether the ping is received at the hot prong PH of the test receiver 230. If the ping is received, such a condition indicates that the hot receptable of the Nth outlet then being tested is properly connected to a "hot" line, such as the first hot line 110 shown in FIGS. 2 and 3. That is, a reversed polarity configuration is not present. The method then proceeds to Operation 610.

As shown in Operation 610, the method may include performing bootleg ground and/or other tests. As discussed above, bootleg ground testing may be accomplished using time domain reflectometry, resistance based testing, or other techniques. Further, it is to be appreciated that bootleg ground testing, as per Operation 610, may occur before reversed polarity testing, as per Operation 608. Further, for at least one embodiment, the test receiver may be configured to perform both bootleg ground and reversed polarity testing substantially simultaneously. Likewise, other tests of the Nth outlet may be conducted including, but not limited to, testing for one or more of the conditions identified in Table 1 above. The method may then proceed to Operation 612.

As shown in Operation 612, the method may include determining whether the bootleg ground tests and/or other tests pass. When all such tests return "pass" ratings, the method proceeds to optional Operation 614, wherein the log may be updated to indicate a "proper" circuit configuration for the Nth outlet then under test. When one or more of such tests return a "fail" rating, the method proceeds with optional Operation 616, wherein the log may be updated to indicate a "fault" circuit configuration. When a "fault" circuit configuration is detected, other actions may also be performed and perhaps required of an installer by business practices, electrical codes, or otherwise. Such other actions may include open-circuiting a circuit breaker on which the faulty outlet resides, taping over the outlet, or otherwise. The present disclosure is not limited to and may include for one or more embodiments any such "other actions" if any.

As shown in Operation 618, when the ping is not detected on the hot prong PH of test receiver 230 for the Nth outlet then being tested, the method may include determining whether the ping is present on the neutral prong PN of the test receiver 230 for the Nth outlet then being tested. As discussed above, the presence of the ping on the neutral prong indicates a reversed polarity configuration of the Nth outlet then being tested. Accordingly, it is to be appreciated that "other actions" such as one or more of those discussed above may be required and/or implemented given the extremely hazardous condition that revered polarity outlets present to persons and property. When such reversed polarity configuration is detected for a Nth outlet then under test, logging of such condition may occur, as per Operation 620. Such logging may be optional and/or required and, for one or more embodiments, may require reporting of such condition to one or more local building inspecting and/or regulatory bodies. As shown, other testing may also occur, as per Operations 610 to 616.

As shown in Operation 618, the method may result of the ping not being detected at either of the hot or neutral prongs of the test receiver. This condition indicates a non-wired outlet or, an outlet having a ground receptacle wired to a hot conducting line. Such a configuration should result in a triggering of the circuit breaker into an open-circuit configuration. But, absent the same occurring, as may arise for a faulty circuit breaker, testing of the same can be determined by use of prior art tests for each of the ground line, hot line and neutral lines being connected (i.e., not "open"). Accordingly, testing for such a configuration is not shown in FIG. 6 but may occur by use of specific testing for the same and/or the use of one more other tests per Operation 610.

As shown in Operation 622, the method may include re-testing the Nth outlet then under test and/or testing another outlet. Retesting may be desired when further validation is desired and/or a ping is not detected at the Nth outlet then under test, for example, because of other signals and/or noise on a given circuit and/or electrical system. Such retesting may resume with Operation 602. Also, testing of another outlet may be desired to verify multiple outlets within a dwelling are code complaint (or non-code compliant) configured and/or in an attempt to identify at least one outlet that is code-compliant configured, which are also referred to herein as being "properly" configured. If additional outlet testing is desired, the method continues with Operation 604.

As shown in Operation 626, the method may terminate with updating logs, taking other actions, and otherwise.

Although various embodiments of the claimed invention have been described above with a certain degree of particularity, or with reference to one or more individual embodiments, those skilled in the art could make numerous alterations to the disclosed embodiments without departing from the spirit or scope of the claimed invention. The use of the terms "approximately" or "substantially" means that a value of an element has a parameter that is expected to be close to a stated value or position. However, as is well known in the art, there may be minor variations that prevent the values from being exactly as stated. Accordingly, anticipated variances, such as 10% differences, are reasonable variances that a person having ordinary skill in the art would expect and know are acceptable relative to a stated or ideal goal for one or more embodiments of the present disclosure. It is also to be appreciated that the terms "top" and "bottom", "left" and "right", "up" or "down", "first", "second", "next", "last", "before", "after", and other similar terms are used for description and ease of reference purposes only and are not intended to be limiting to any orientation or configuration of any elements or sequences of operations for the various embodiments of the present disclosure. Further, the terms "coupled", "connected" or otherwise are not intended to limit such interactions and communication of signals between two or more devices, systems, components or otherwise to direct interactions; indirect couplings and connections may also occur. Further, the terms "and" and "or" are not intended to be used in a limiting or expansive nature and cover any possible range of combinations of elements and operations of an embodiment of the present disclosure. Other embodiments are therefore contemplated. It is intended that all matter contained in the above description and shown in the accompanying drawings shall be interpreted as illustrative only of embodiments and not limiting. Changes in detail or structure may be made without departing from the basic elements of the invention as defined in the following claims.

Further, a reference to a computer executable instruction includes the use of computer executable instructions that are configured to perform a predefined set of basic operations in response to receiving a corresponding basic instruction selected from a predefined native instruction set of codes. It is to be appreciated that such basic operations and basic instructions may be stored in a data storage device permanently and/or may be updateable, but, are non-transient as of a given time of use thereof. The storage device may be any device configured to store the instructions and is communicatively coupled to a processor configured to execute such instructions. The storage device and/or processors utilized operate independently, dependently, in a non-distributed or distributed processing manner, in serial, parallel or otherwise and may be located remotely or locally with respect to a given device or collection of devices configured to use such instructions to perform one or more operations.

What is claimed is:
1. A system for testing an electrical outlet, comprising:
   a test receiver, comprising:
      a hot receive prong configured for electrical coupling the test receiver with a first hot line of an electrical circuit; and
      a signal receiver, coupled to the hot receive prong, configured to detect when a ping signal is present on the first hot line; and
   a test transmitter, comprising:

a hot test prong configured for electrical coupling the test transmitter with a second hot line of the electrical circuit;
  wherein the first hot line and the second hot line are electrically coupled via the electrical circuit; and
a signal generator, coupled to the hot test prong, configured to generate the ping signal on the second hot line.

2. The system of claim 1,
wherein the first hot line is electrically coupled to a first hot receptacle of a first electrical outlet; and
wherein the hot receive prong is configured for mating with the first hot receptacle; and
wherein, when mated, the test receiver is electrically coupled to the first hot line via the hot receive prong and the first hot receptacle.

3. The system of claim 2,
wherein the second hot line is electrically coupled to a second hot receptacle of a second electrical outlet; and
wherein the hot test prong is electrically coupled with the second hot line via the second hot receptacle.

4. The system of claim 2,
wherein the electrical circuit includes at least one circuit breaker coupled to the first hot line and the second hot line;
wherein the electrical circuit includes a main circuit breaker coupling the at least one circuit breaker to an external power line via a main hot line;
wherein the main circuit breaker, when configured in an open-circuit configuration, electrically isolates the main hot line from the external power line; and
wherein the hot test prong is electrically coupled to the main hot line.

5. The system of claim 2,
wherein the test receiver further comprises:
  a neutral receive prong;
    wherein the neutral receive prong is configured for electrical coupling with a first neutral line of the electrical circuit; and
  wherein the signal receiver is coupled to the neutral receive prong and configured to:
    detect when a ping signal is present at the neutral receive prong; and
    when the ping signal is detected at the neutral receive prong generate a first fault condition signal.

6. The system of claim 5,
wherein the first neutral line is electrically coupled to a first neutral receptacle of the first electrical outlet;
wherein the neutral receive prong is electrically coupled with the first neutral line via the first neutral receptacle; and
wherein the first fault condition signal indicates a reversed polarity wiring configuration exists for the first electrical outlet.

7. The system of claim 6,
wherein the test receiver further comprises:
  a ground receive prong; and
  a bootleg ground tester, coupled to the ground receive prong, configured to:
    detect a bootleg ground wiring configuration of a first ground line with one of the first hot line and the first neutral line; and
    when the bootleg ground wiring configuration is detected, generate a second fault condition signal.

8. The system of claim 7,
wherein the bootleg ground tester utilizes time domain reflectometry.

9. The system of claim 7,
wherein the first ground line is electrically coupled to a first ground receptacle of the first electrical outlet;
wherein the ground receive prong is electrically coupled with the first ground line via the first ground receptacle; and
wherein the second fault condition signal indicates a bootleg ground wiring configuration exists for the first electrical outlet.

10. The system of claim 7,
wherein upon generation of each of the first fault condition signal and the second fault condition signal, the test receiver is further configured to generate a third fault signal indicating existence of a reversed polarity bootleg ground wiring configuration for the second electrical outlet.

11. The system of claim 10,
wherein the test receiver further comprises:
  an output module configured to provide a humanly perceptible output indicative of, when present, the first fault signal, the second fault signal and the third fault signal.

12. The system of claim 10,
wherein the test receiver further comprises a wireless communications interface module configured to communicate, when present, the first fault signal, the second fault signal and the third fault signal to a mobile device.

13. The system of claim 10,
wherein the test receiver further comprises a wireline communications interface module configured to communicate, when present, the first fault signal, the second fault signal and the third fault signal to the test transmitter.

14. A receiver, for testing compliance of an electrical circuit with an electrical code, comprising:
  a hot receive prong configured for electrical coupling a test receiver with a first hot line of an electrical circuit;
  a neutral receive prong configured for electrical coupling the test receiver with a first neutral line of the electrical circuit;
  a signal receiver, coupled to each of the hot receive prong and the neutral receive prong, configured to:
    detect when a ping signal is present at either of the hot receive prong or the neutral receive prong; and
    when the ping signal is detected at the neutral receive prong, generate a first fault condition signal.

15. The receiver of claim 14,
wherein the ping originates from a test transmitter electrically coupled to a second hot line of the electrical circuit; and
wherein the first hot line and the second hot line are commonly electrically coupled to a first circuit breaker.

16. The receiver of claim 14, further comprising:
  a ground receive prong configured for electrical coupling the test receiver with a first ground line of the electrical circuit; and
  a bootleg ground tester, coupled to the ground receive prong, configured to:
    detect a bootleg ground wiring configuration of the first ground line with one of the first hot line and the first neutral line; and
    when the bootleg ground wiring configuration is detected, generate a second fault condition signal.

17. The receiver of claim 16, further comprising:
an output module, coupled to the signal receiver and the bootleg ground tester, configured to generate a test result based upon at least a presence or absence of the first fault condition signal and the second fault condition signal;

wherein an electrical outlet having a neutral receptacle, a ground receptacle and a hot receptacle is configured for electrical connection with each of the first neutral line, the first hot line and the first ground line;

wherein, during testing, the hot receive prong is electrically coupled to the hot receptacle;

wherein, during testing, the neutral receive prong is electrically coupled to the neutral receptacle;

wherein, during testing, the ground receive prong is electrically coupled to the ground receptacle;

wherein the first fault signal, when generated, is indicative of a reversed polarity configuration for the electrical outlet; and wherein the second fault signal, when generated, is indicative of a bootleg ground configuration for the electrical outlet.

18. The receiver of claim 17,
wherein the test result is one of the test results of Table 1.

19. A method, for testing an electrical outlet for compliance with an electrical code, comprising:

monitoring a hot receptacle of an electrical outlet for a presence of a ping;

monitoring a neutral receptacle of an electrical outlet for a presence of the ping; and generating a first fault signal when the ping is detected at the neutral receptacle;

wherein the first fault signal indicates an electrical circuit coupling the electrical outlet to a circuit breaker is configured into a reversed polarity wiring configuration for the electrical outlet.

20. The method of claim 19, further comprising:

performing a bootleg ground test for the electrical outlet, the electrical outlet including a ground receptacle; and generating a second fault signal when the bootleg ground test indicates a ground jumper connects the ground receptacle with the neutral receptacle; and generating a third fault signal when the bootleg ground test indicates the ground jumper connects the ground receptacle with the hot receptacle;

wherein each of the second fault signal and the third fault signal indicate a bootleg ground wiring configuration for the electrical outlet wherein generation of the first fault signal with either of the second fault signal and the third fault signal indicates a reversed polarity bootleg ground wiring configuration for the electrical outlet.

* * * * *